(12) United States Patent
Yu et al.

(10) Patent No.: US 9,145,503 B2
(45) Date of Patent: Sep. 29, 2015

(54) LOW TEMPERATURE SINTERING CONDUCTIVE METAL FILM AND PREPARATION METHOD THEREOF

(75) Inventors: Ji-Hun Yu, Dongnae-gu (KR); Sangsun Yang, Gyeongsangnam-do (KR); Yong-Jin Kim, Gyeongsangnam-do (KR)

(73) Assignee: Korea Institute of Machinery and Materials, Daejeon (KR)

( * ) Notice: Subject to any disclaimer, the term of this patent is extended or adjusted under 35 U.S.C. 154(b) by 186 days.

(21) Appl. No.: 13/991,130

(22) PCT Filed: Oct. 20, 2011

(86) PCT No.: PCT/KR2011/007841
§ 371 (c)(1),
(2), (4) Date: May 31, 2013

(87) PCT Pub. No.: WO2012/074200
PCT Pub. Date: Jun. 7, 2012

(65) Prior Publication Data
US 2013/0251966 A1    Sep. 26, 2013

(30) Foreign Application Priority Data

Dec. 2, 2010 (KR) .................. 10-2010-0121967

(51) Int. Cl.
| C09D 11/52 | (2014.01) |
| B22F 1/00 | (2006.01) |
| B82Y 30/00 | (2011.01) |
| H05K 3/12 | (2006.01) |

(52) U.S. Cl.
CPC .............. *C09D 11/52* (2013.01); *B22F 1/0022* (2013.01); *B82Y 30/00* (2013.01); *H05K 3/1283* (2013.01); *B22F 1/007* (2013.01); *B22F 1/0074* (2013.01); *H05K 3/12* (2013.01); *Y10T 428/24909* (2015.01); *Y10T 428/24917* (2015.01); *Y10T 428/256* (2015.01)

(58) Field of Classification Search
CPC ......... C09D 11/38; C09D 11/52; H05K 1/097
USPC ...................................... 106/31.92
See application file for complete search history.

(56) References Cited

U.S. PATENT DOCUMENTS

2008/0134936 A1* 6/2008 Kamikoriyama et al. . 106/31.92
2008/0216604 A1* 9/2008 Cho et al. ................ 75/345

FOREIGN PATENT DOCUMENTS

| JP | 03-077202 | 4/1991 |
| KR | 10-0833869 | 5/2008 |
| KR | 10-0911439 | 8/2009 |
| KR | 10-2009-0131454 | 12/2009 |
| WO | WO 98/37133 | 8/1998 |
| WO | WO 2004/005413 | 1/2004 |

OTHER PUBLICATIONS

International Search Report from PCT Application No. PCT/KR2011/007841 dated May 9, 2012.

* cited by examiner

*Primary Examiner* — Gerard Higgins
(74) *Attorney, Agent, or Firm* — Klarquist Sparkman, LLP

(57) ABSTRACT

A low-temperature sintered conductive metal ink and a method for preparing the same are provided. To be specific, the preparation method includes the following steps of: preparing the conductive film or pattern by printing a conductive metal ink including metal nanocolloids, metal salts, and polymers reacted with the metal salts and preparing the metal nanocolloids (step 1); preparing a mixture by mixing the metal salts and polymers (step 2); preparing the metal ink by stirring the metal nanocolloids and the metal salt/polymer mixture prepared at steps 1 and 2 (step 3); printing the metal ink prepared at step 3 (step 4); and drying and thermally treating a product printed at step 4 (step 5).

13 Claims, 6 Drawing Sheets

LOW TEMPERATURE SINTERING CONDUCTIVE METAL FILM AND PREPARATION METHOD THEREOF

CROSS-REFERENCE TO RELATED APPLICATIONS

This application claims priority from Korean Patent Application No. 10-2010-0121967, filed on Dec. 2, 2010, in the Korean Intellectual Property Office, the disclosure of which is incorporated herein by reference in its entirety.

BACKGROUND

1. Field of the Invention

The present invention relates to a low-temperature sintered conductive metal film and a preparation method thereof.

2. Description of the Related Art

Generally, technology developments for forming fine patterns for wiring formation is receiving attention as demands increase for high reliability and high conductivity for forming an electrode or a circuit of display, FPCB, RFID, etc.; for a larger screen, high efficiency, and high resolution for display; and for using a flexible substrate. In the mean time, competitions for various flat-panel display types such as PDP and LCD have been intensified that the efforts have been made to reduce the cost of raw materials including electrode materials and the cost of processing these. Also, with various portable electronic devices getting smaller, chips used for the devices are required to have a higher density and a higher integrity.

One of the general methods for forming a conductive layer such as wiring pattern, etc. on a substrate embedded in various electronic devices is the metal plating. Another methods include the heat curing of a resin after forming a wiring on a substrate by applying and printing a conductive paste, which is a liquefied thermosetting resin material, with electro-conductive powder dispersed therein, or a thin film forming method which applies a ultra-fine metal particle dispersion liquid, which is dispersed uniformly into an organic dispersion medium, onto a semiconductor substrate and then heats the liquid to eliminate an organic solvent and fuse the ultra-fine metal particles. However, the plating method has a shortcoming of a low productivity, because a growth speed of a plated film from a metal ion is slow and accordingly considerable time is required to form a thick (more than about 10 μm of thickness) conductive film, conductive layer, or layer short. And the methods of forming a conductive layer by applying or printing the conductive paste or the ultra-fine metal dispersion liquid also have a shortcoming in precisely controlling the thickness and the forming position of the conductive layer. In particular, the conductive paste comprising a resin and electro-conductive powder has a difficulty in forming the conductive layer with a high precision in terms of the forming position and shape, because the conductive layer has a relatively higher viscosity (approximately 100 mpa·s at 25° C.). But if resin element is not included in order to reduce the viscosity of the ultra-fine metal particle dispersion liquid, cracks may be created in a conductive layer and the adhesion of the conductive layer to the substrate may deteriorate for forming a thick conductive layer.

Meanwhile, an inkjet technology is a new type preparation process, which has been developed amid the pursuits of productivity, cost reduction, and creation of new industrial fields with the display industry becoming larger and the process simplified. An inkjet printing is a contactless technology, which prints a pattern by means of a jetting ink ejected from a nozzle of a print head. For the inkjet printing technology, a print head technology has been developed a lot, but designing an ink has still remained as a challenge. The ink is required to meet sophisticated physiochemical characteristics to obtain optimum driving conditions and gain durability of a printing system and a desirable printing pattern. In the case of a metal ink, a preparation for homogeneous and stable nanoparticles is preferred of all things.

A metal ink for inkjet, as a material mainly forming a fine conductor or a thin conductive film, uses metal nanoparticles with the particle size of a few or a few dozens of nanometers. Recently, researches to form, for example, fine conductors by means of the inkjet technology after preparing the metal ink by using silver nanoparticles are in progress, but due to a high-cost of production involved in using silver particles, there are many limitations to the industrial applications. Therefore, a need for copper nanoparticles, as a low-cost material replacement with a relatively high conductivity, has been discussed continuously, but preparing stable copper nanoparticles may be challenging due to a low stability, i.e., a high oxidativity and developing a preparation of stable copper nanoparticles in a uniform particle size is still insignificant because the growth of the particles is too fast during the preparation of the nanoparticles.

Korean Patent No. 10-0911439 discloses a waterborne conductive ink for inject added with a dispersion agent and dispersion solvent of a nano silver colloid solution comprising nano silver particles with the size of 20 nm or less. Using the silver nanoparticles may make the handling easy in terms of safety and environment and is desirable for storage and dispersion stability, and may make the preparation of a conductive ink possible for printing by the inkjet method. Still, the production cost may be high due to the use of the expensive silver.

Korean Patent No. 10-0833869 discloses an ink composition comprising a metal nanoparticle mixture of copper nanoparticles and silver nanoparticles and an organic solvent. The ink composition comprising the metal nanoparticle mixture of the copper nanoparticles and silver nanoparticles and the organic solvent may control an ion migration phenomenon effectively on the conductive wiring comprising silver as a material without a decline in conductivity. But, using the copper nanoparticles may pose problems of securing the stability of the copper particles and of performing a heat treatment at a high temperature after printing an ink due to a high sintering temperature of copper.

Accordingly, the inventors of the present invention completed the present invention by developing a conductive metal film presenting a low sintering temperature after mixing metal nanocolloids, metal salts, and polymers, preparing a metal ink whose nanoparticles are stable, and printing the metal ink.

SUMMARY OF THE INVENTION

The objective of the present invention is to provide a low-temperature sintered conductive metal film and a method for preparing the same.

In order to achieve the aforementioned objective, the present invention provides a conductive metal film or pattern prepared by printing a conductive metal ink comprising metal nanocolloids, metal salts, and polymers reacted with the metal salts, and also provides a method for preparing the conductive metal film or pattern including the following steps of: preparing metal nanocolloids (step 1); preparing a mixture by mixing metal salts and polymers (step 2); preparing a metal ink by stirring the metal nanocolloids and the metal salt/polymer mixture prepared at steps 1 and 2 (step 3); printing the metal ink prepared at step 3 (step 4); and thermally treating a product printed at step 4 (step 5).

According to the present invention, the conductive metal film or pattern may have advantageous effects of a reduced production cost by using copper nanoparticles instead of conventional silver nanoparticles and of a lower sintering temperature. Due to these effects, the conventional problem of a high sintering temperature in the use of the conventional copper nanoparticles may be overcome and thus the conductive metal film or pattern according to the present invention may be applied to substrates of flexible plastic material.

DESCRIPTION OF THE PREFERRED EMBODIMENTS

Hereinafter, the present invention is described in detail.

Figure 1:
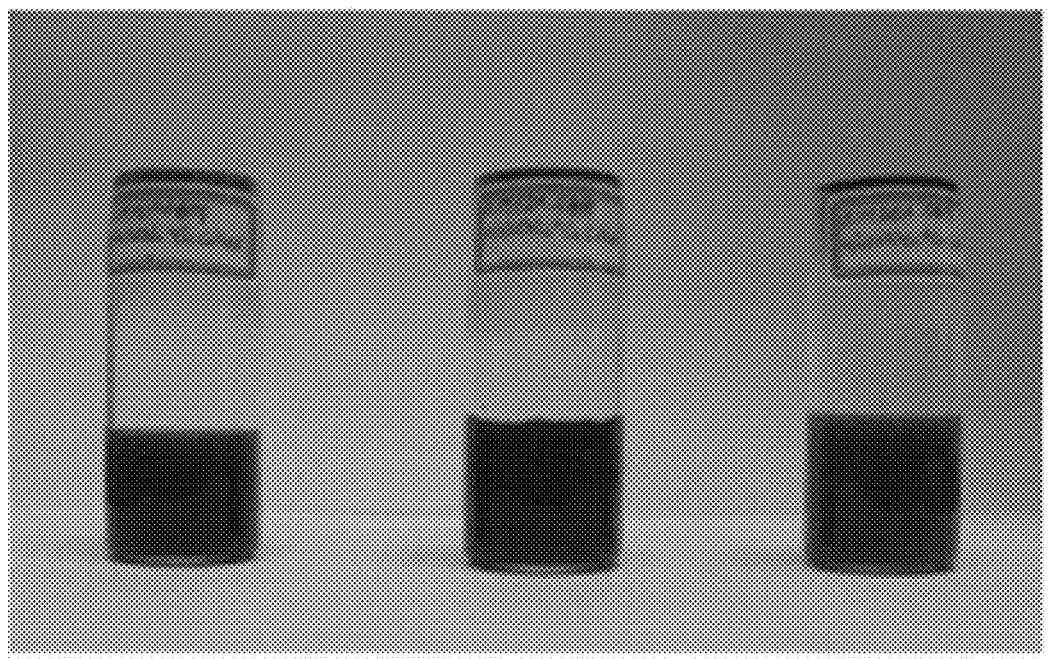
FIG. 1 are images of the conductive metal ink used for the present invention.

The present invention provides a conductive metal film or pattern prepared by printing a conductive metal ink comprising metal nanocolloids, metal salts, and polymers reacted with the metal salts. FIG. 1 shows the images of the conductive metal ink used for the conductive metal film or pattern according to the present invention.

The conductive metal ink used for the present invention ensures a stability of metal nanoparticles by comprising metal nanocolloids, and the conductive metal film or pattern presenting a low sintering temperature, according to the present invention, may be prepared by printing the conductive metal ink.

According to the present invention, the metal nanocolloids, a component of the conductive mental ink, comprise conductive mental particles selected from the group consisting of copper or aluminum. The conductive metal particles may have a high electric conductivity, existing in the form of a nanocolloid and in a stable form notwithstanding the problems associated with coagulation.

The size of the conductive metal particles may desirably range between 1 and 500 nm.

If the size of the metal particles is less than 1 nm, preparing the metal nanocolloids may be challenging; and if the size of the conductive metal particles exceeds 500 nm, dispersibility may deteriorate and a high sintering temperature may be required for sintering.

According to the present invention, the metal nanocolloids may desirably include a conductive metal with 0.1 or 80 wt %.

If the metal nanocolloids include a conductive metal with less than 0.1 wt %, the electric conductivity of the conductive metal film or pattern according to the present invention may deteriorate due to a shortage of metal particles in the ink; and if metal nanocolloids include a conductive metal with over 80 wt %, printability may deteriorate due to a degraded fluidity.

According to the present invention, the metal salts, a component of the metal ink, may desirably be selected from the group consisting of metal organics, metal nitrides, and metal chlorides. Due to the inclusion of the metal compounds, conductive metal atoms may be precipitated from the metal compounds and the electric conductivity of the conductive metal film or pattern according to the present invention may improve as the conductive metal atoms fill the gaps between the metal nanoparticles.

According to the present invention, the polymers reacted with the metal salts in the metal ink may desirably be selected from the group consisting of polyvinyl pyrrolidone, ethylene diamine, and diethyleneamine. The polymers may overcome a problem of a high sintering temperature of copper particles to prepare a conductive metal ink presenting a low sintering temperature.

According to the present invention, the metal ink may additionally include a viscosity controlling agent. Due to the inclusion of the viscosity controlling agent, a viscosity of the conductive metal ink used for the present invention may be controlled and thus the adhesion to a substrate may be desirable for printing the conductive metal film or pattern according to the present invention.

Printing the conductive pattern or conductive metal film according to the present invention may be performed by a method selected from the group consisting of gravure printing, offset printing, inkjet printing, screen printing, imprint, and spin coating. Those printing methods, unlike a conventional method for preparing a pattern or film, prepare a pattern or film through one process of printing an ink. Therefore, printing the conductive pattern or conductive metal film according to the present invention may be performed by means of one-step process.

Furthermore, the present invention provides a method for preparing the conductive metal film or pattern including the following steps of:

preparing metal nanocolloids (step 1);

preparing a mixture by mixing metal salts and polymers (step 2);

preparing a metal ink by stirring the metal nanocolloids and the metal salt/polymer mixture prepared at steps 1 and 2 (step 3);

printing the metal ink prepared at step 3 (step 4); and heating the product printed at step 4 (step 5).

Figure 2:
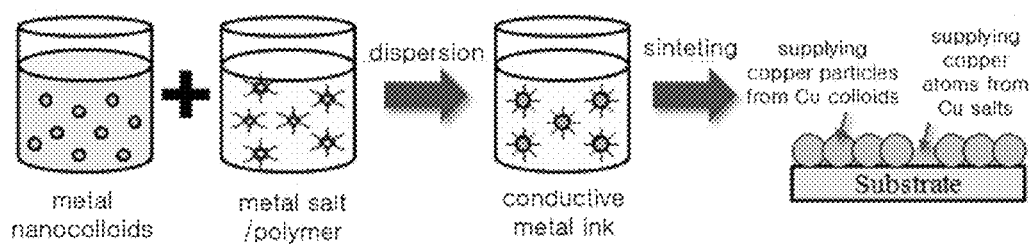
FIG. 2 is a drawing illustrating a method for preparing the conductive metal film or pattern, according to the present invention.

FIG. 2 schematically illustrates the procedure of the preparation method.

According to one embodiment, step 1 prepares metal nanocolloids. The metal nanocolloids at step 1 may be desirable for dispersibility as the conductive metal particles are dispersed in the form of a colloid and for storage stability with stable nanoparticles. The metal nanocolloids may desirably be prepared by means of an electrical wire explosion method, but not limited thereto.

The most important things in the preparation of the metal nanoparticles include preparing unpolluted high-purity particles in an economical way and taking a follow-up measure for treating the prepared particles without pollution. The electrical wire explosion method may prepare the metal nanoparticles without pollution and accordingly the nanocolloids may comprise the conductive metal nanoparticles with a high purity.

According to one embodiment, step 2 prepares a mixture by mixing the metal salts and polymers. The metal salts at step 2 may desirably be selected from the group consisting of metal organics, metal nitrides, and metal chlorides and, due to the inclusion of metal compounds, conductive metal atoms can be precipitated from the metal compounds and the precipitated conductive metal atoms fill the gaps between the metal nanoparticles to improve the electric conductivity of the conductive metal film or pattern prepared according to the present invention.

The polymers at step 2, as polymers reacted with the metal salts, may desirably be selected from the group consisting of polyvinyl pyrrolidone, ethylene diamine, and diethyleneamine, but not limited thereto.

At step 2, a concentration for mixing the metal salts and the polymers may desirably range between 0.01 and 1 mol, and the metal salts and the polymers with the concentration are desired to be added individually to de-mineralized water for mixing.

If the metal salts and the polymers are mixed at a concentration less than 0.01 mol, copper atoms may not be precipitated sufficiently and may not fill the gaps between the conductive metal particles included in the nanocolloids, which may decrease the electric conductivity. And if the metal salts and the polymers are mixed at a concentration exceeding 1 mol, a viscosity of the conductive metal ink used for the preparation method according to the present invention may increase, which may not be desirable for printing the conductive metal film or pattern.

According to one embodiment, step 3 prepares a metal ink by stirring the metal nanocolloids and the metal salt/polymer mixture prepared at steps 1 and 2. The stirring at step 3 is performed with a device or by a method to disperse completely the metal nanaocolloids and the metal salt/polymer mixture. By stirring at step 3, the conductive metal ink, which may print the conductive film or pattern of the present invention, may be prepared.

According to one embodiment, step 4 prints the metal ink prepared at step 3. By printing at step 4, a shape of the conductive metal film or pattern may be formed. Printing at step 4 may be performed by a method selected from the group consisting of gravure printing, offset printing, inkjet printing, screen printing, imprint, and spin coating.

Those printing methods, unlike a conventional method for preparing a pattern or film, may prepare a pattern or film through one process for printing an ink. Therefore, the conductive pattern or conductive metal film according to the present invention may be formed by means of one-step process.

The printing at step 4 may desirably be performed in a gas atmosphere selected from the group consisting of argon, hydrogen, and air. By printing in the gaseous atmosphere at step 4, the metal film may have an anti-oxidant effect and the processing cost may be reduced by controlling such variables as a sintering temperature and sintering time.

According to one embodiment, step 5 treats thermally the conductive metal ink printed at step 4. The thermal treatment may desirably be performed at a temperature of 100 to 500° C. If the thermal treatment is performed at a temperature less than 100° C., residues may remain inside a pattern or film and the adhesion to a substrate may deteriorate. And if the thermal treatment is performed at a temperature exceeding 500° C., the substrate may be damaged or the printed pattern may be shrunk, and economic losses may be incurred due to an excessively high temperature.

By means of the thermal treatment within the temperature range, a contact force with the substrate may be desirable and the metal film or pattern whose conductive metal is highly dense may be prepared. Therefore, the metal film or pattern prepared by the methods for preparing the conductive metal film or pattern according to the present invention may be applied to electronic devices used in various fields.

DETAILED DESCRIPTION OF EXEMPLARY EMBODIMENTS

Hereinafter, the present invention will now be described in greater detail with examples. But, the following examples are intended only to be illustrative, and not to limit the scope of the claims.

Preparation Example 1

Preparation of Conductive Metal Ink 1

Step 1: Copper nanocolloids were prepared by soaking a copper wire with the diameter of 0.1 mm in an absolute alcohol and applying a voltage of 2000V to the absolute alcohol 300 times at an interval of 10 seconds.

Step 2: A metal salt/polymer mixture was prepared by mixing 0.1 mol of copper nitrate and 0.1 mol of polyvinyl pyrrolidone individually with 5 ml of de-mineralized water.

Step 3: A conductive metal ink was prepared by stirring the copper nanocolloids and the metal salt/polymer mixture prepared at steps 1 and 2.

Preparation Example 2

Preparation of Conductive Metal Ink 2

The conductive metal ink was prepared in the same manner as Preparation Example 1, except for the differences from Step 2 of Preparation Example 1 that ethylenediamine was used instead of polyvinyl pyrrolidone.

Preparation Example 3

Preparation of Conductive Metal Ink 3

The conductive metal ink was prepared in the same manner as Preparation Example 1, except for the differences from Step 2 of Preparation Example 1 that diethyleneamine was used instead of polyvinyl pyrrolidone.

Example 1

Preparation of Conductive Film 1

Step 1: The film was prepared by drying the conductive metal ink at 80° C. for 12 hours, after dropping the conductive metal ink prepared in Preparation Example 1 onto an alumina substrate by using a squit.

Step 2: The conductive film was prepared by thermally treating the film prepared at step 1 at a temperature of 300° C. for 30 minutes.

Example 2

Preparation of Conductive Film 2

The conductive film was prepared in the same manner as Example 1, except for the difference from Example 1 that the metal ink prepared in Preparation Example 2 was used.

Example 3

Preparation of Conductive Film 3

The conductive film was prepared in the same manner as Example 1, except for the difference from Example 1 that the metal ink prepared in Preparation Example 3 was used.

Experimental Example 1

Measurement of Characteristics of the Metal Salt/Polymer Mixture (1) Measurement of Differential Thermal Analysis For the conductive metal ink of the present invention, the following experiments were conducted in order to observe changes of mass and reaction behavior according to temperatures of the metal ink/polymer mixture.

Figure 3:
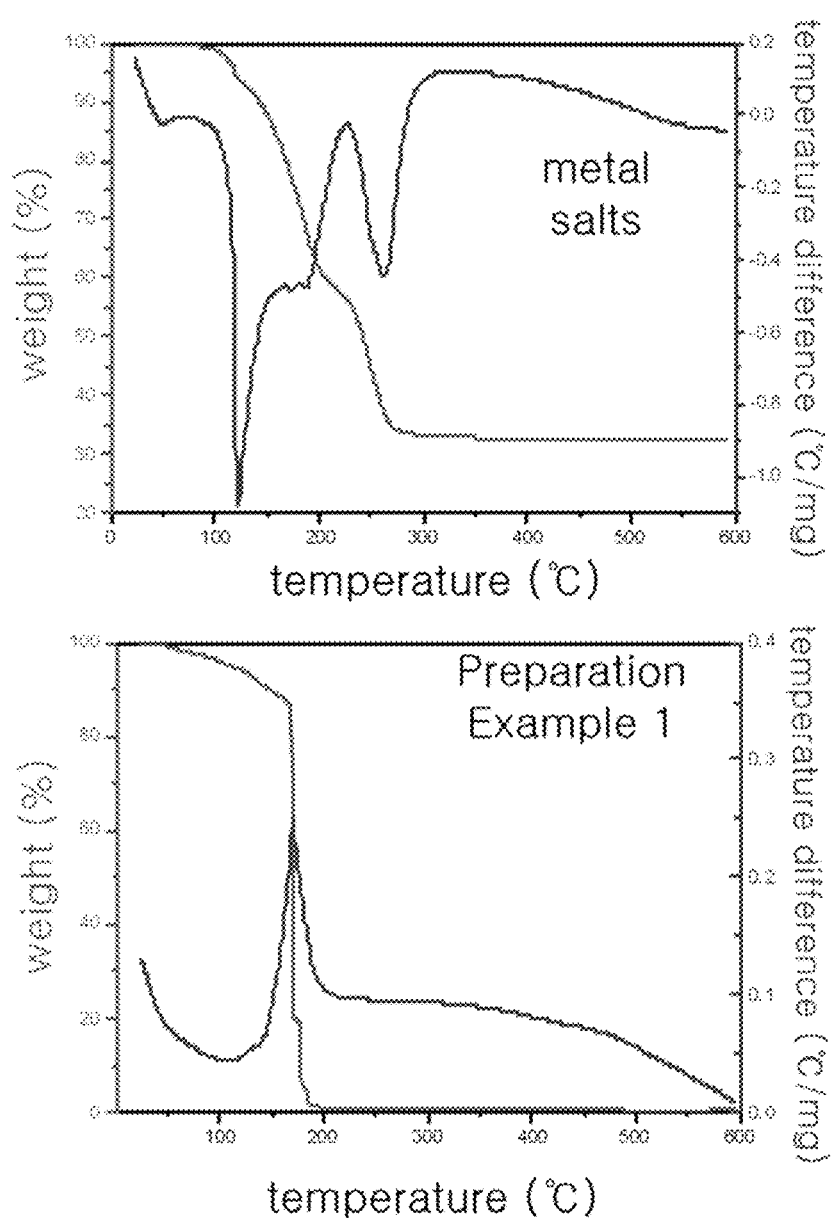
FIG. 3 are graphs obtained as a result of conducting a differential thermal analysis on the metal salt/polymer mixture in the conductive metal ink used for the present invention.

The metal salt/polymer mixtures prepared at Step 2 in Preparation Examples 1 to 3 according to the present invention and copper nitrate metal salt were analyzed by using a differential thermal analyzer and the results of the analysis are provided in FIG. 3.

Referring to FIG. 3, weight of the metal salt/polymer mixture prepared at Step 2 in Preparation Examples 1 to 3 decreased drastically at a temperature of about 300° C. or below. Also, FIG. 3 shows that an endothermic or exothermic peak was created at a temperature at which the weight decreases. From the finding above, the conductive film or pattern according to the present invention was sintered at a temperature of 300° C. or below and the existing problem of a high sintering temperature was overcome.

(2) X-ray Diffraction Analysis

For the conductive metal ink of the present invention, the following experiments were conducted in order to observe a crystal structure after thermally treating the metal salt/polymer mixture.

Figure 4:
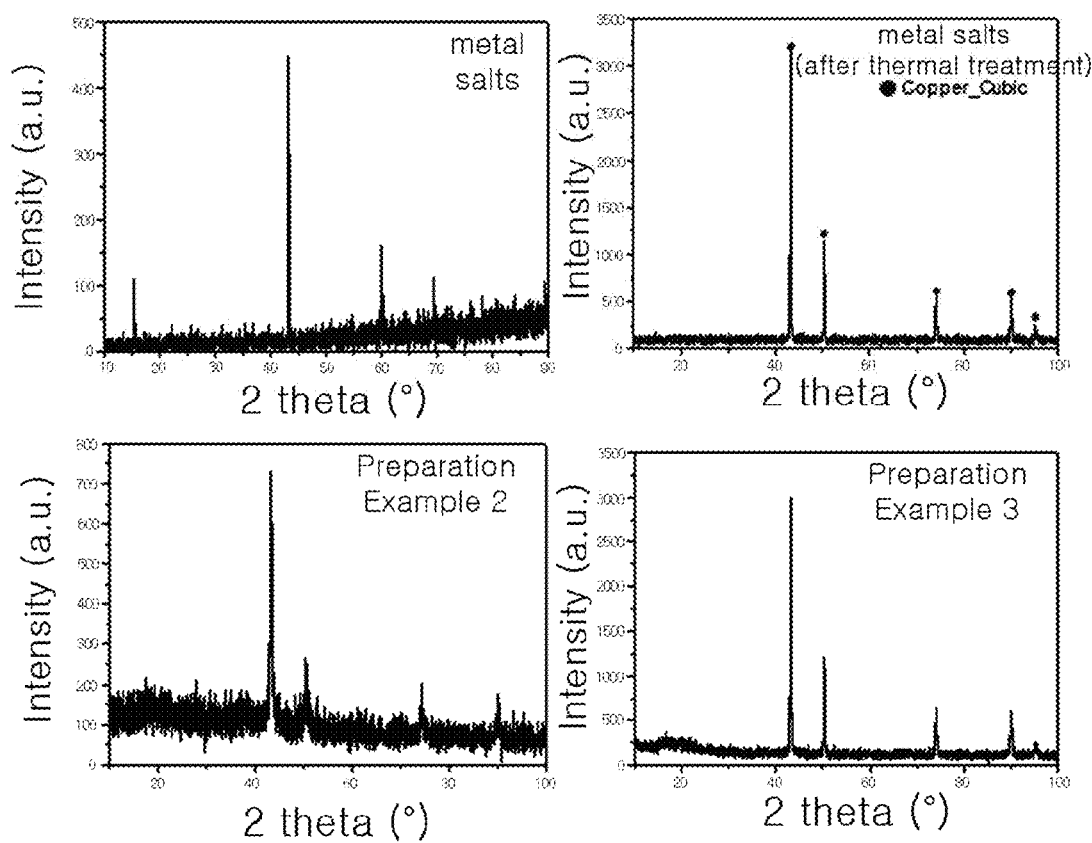
FIG. 4 are graphs obtained as a result of conducting an X-ray diffraction analysis after heating the metal salt/polymer mixture in the conductive metal ink used for the present invention.

Analysis was performed by using an X-ray diffraction analyzer after thermally treating the metal salt/polymer mixtures prepared at Step 2 in Preparation Examples 1 to 3 and the copper nitrate metal salt at a temperature of 300° C. for 30 minutes, and the results of the analysis are provided in FIG. 4.

Referring to FIG. 4, the metal salt/polymer mixtures prepared at Step 2 in Preparation Examples 1 to 3 had all cubic coppers after the mixture was thermally treated at a temperature of 300° C. From the finding above, the polymers were eliminated and only the conductive metal atoms remained after the metal salt/polymer mixture was treated thermally, and thus the conductive film or pattern according to the present invention can have a high electric conductivity by using the conductive ink.

(3) Observation through Scanning Electron Microscope

For the conductive metal ink of the present invention, the following experiments were conducted in order to observe a fine structure after thermally treating the metal salt/polymer mixture.

Figure 5:
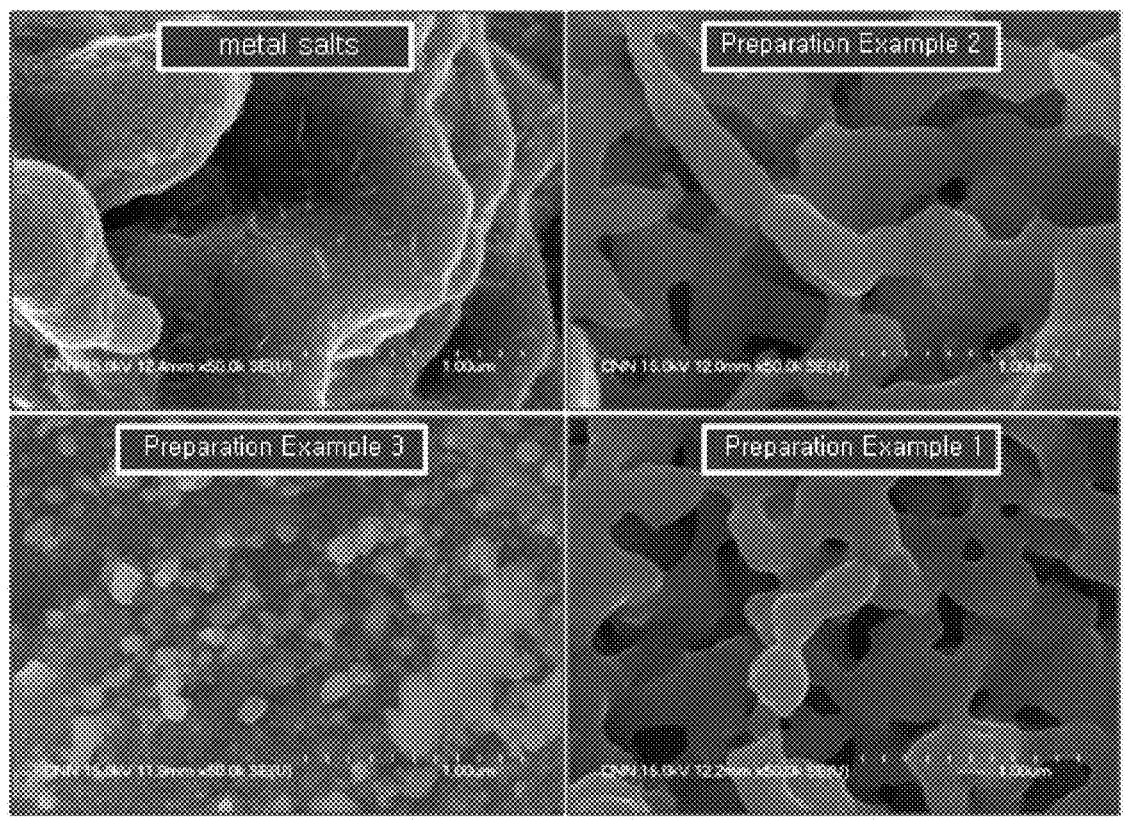
FIG. 5 are images obtained as a result of observing the metal salt/polymer mixture in the conductive metal ink used for the present invention through a scanning electron microscope after heating the mixture.

Observation was made through a field emission-type scanning electron microscope after thermally treating the metal salt/polymer mixtures prepared in Preparation Examples 1 to 3 and the copper nitrate metal salt at a temperature of 300° C. for 30 minutes, and the results thereof are provided in FIG. 5.

Referring to FIG. 5, the copper nitrate metal salt was not yet completely resolved and remained as copper salt and polymer, but the metal salt/polymer mixtures of Preparation Examples 1 to 3 were completely resolved and a neck was formed by copper nanoparticles, copper film, and sintering after the metal salts and polymers reacted with each other. From this, sintering was made. From the finding above, it was confirmed that the conductive metal film or pattern according to the present invention can present an electric conductivity by the printing of the metal ink.

Experimental Example 2

Analysis of Characteristics of the Conductive Film (1) Observation through Scanning Electron Microscope In order to observe a surface of the film printed by the conductive metal ink according to the present invention, the following experiments were conducted.

Figure 6:
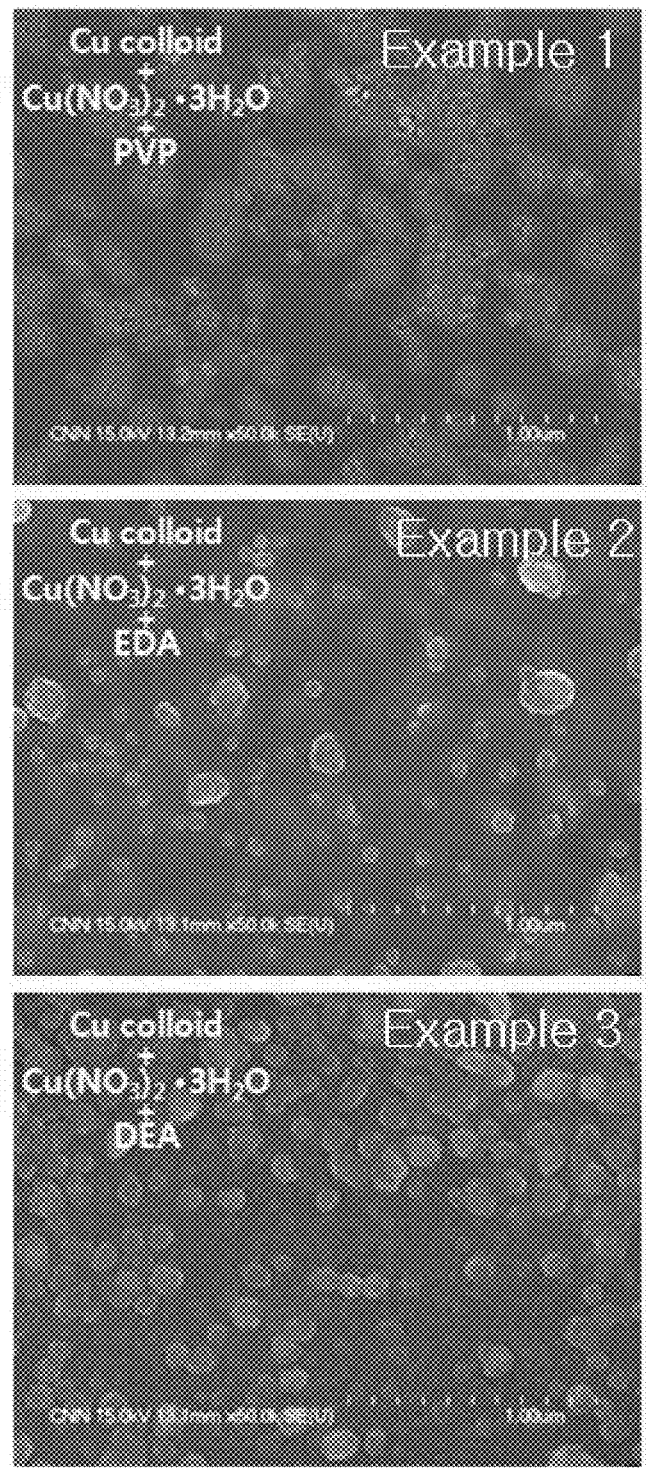
FIG. 6 are images obtained as a result of observing the conductive film according to the present invention through a scanning electron microscope.

The conductive films prepared in Examples 1 to 3 according to the present invention were observed through a field emission-type scanning electron microscope and the results thereof are provided in FIG. 6.

Referring to FIG. 6, the copper nanoparticles of the conductive films prepared in Examples 1 to 3 were dispersed desirably and a structure of the films was tight. From the finding above, it was confirmed that the conductive metal film according to the present invention can have the tight structure and thus can present desirable characteristics for the applications to electronic devices.

(2) Measurement of Electric Conductivity

In order to measure an electric conductivity of the film printed by the conductive metal ink according to the present invention, the electric conductivity of the conductive film prepared through Example 3 was measured and the results thereof are provided below.

The conductive film prepared through Example 3 according to the present invention had a desirable electric conductivity of 65 m$\Omega$/sq. From this measurement above, it was confirmed that the conductive metal film according to the present invention can have a desirable electric conductivity and thus it can be applied to various electronic devices.

What is claimed is:

1. A conductive metal ink comprising a copper nanocolloid, a copper salt, and ethylene diamine that has been reacted with the copper salt.

2. The conductive metal ink as set forth in claim 1, wherein the copper nanocolloid comprises copper particles.

3. The conductive metal ink as set forth in claim 2, wherein a size of the copper particles is in a range of 1 to 500 nm.

4. The conductive metal ink as set forth in claim 1, wherein the weight of copper in the copper nanocolloid is in the range of 0.1 to 80 wt %.

5. The conductive metal ink as set forth in claim 1, wherein the copper salt is selected from the group consisting of a copper organic, copper nitrate, and copper chloride.

6. The conductive metal ink as set forth in claim 1, further comprising a viscosity controlling agent.

7. A method for preparing a conductive metal ink, the method comprising:
   preparing a copper nanocolloid;
   preparing a mixture of a copper salt and ethylene diamine, which reacts with the copper salt; and
   preparing the metal ink by stirring the copper nanocolloid and the mixture of the copper salt and ethylene diamine that has reacted with the copper salt.

8. The method for preparing the conductive metal ink as set forth in claim 7, wherein the copper nanocolloid is prepared by means of an electrical wire explosion method.

9. The method for preparing the conductive metal ink as set forth in claim 7, wherein in the mixture of the copper salt and the ethylene diamine, a concentration for each of the copper salt and the ethylene diamine is each in a range of 0.01 to 1 mol.

10. A method for preparing a conductive metal film, the method comprising:
   applying the conductive metal ink of claim 1 to a substrate, wherein the applying is performed by a method selected from the group consisting of gravure printing, offset printing, inkjet printing, screen printing, imprint, and spin coating; and
   thermally treating the substrate having the conductive metal ink thereon.

11. The method for preparing the conductive metal film as set forth in claim 10, wherein the applying is performed in an atmosphere of gas selected from the group consisting of argon, hydrogen, and air.

12. The method for preparing the conductive metal film as set forth in claim 10, wherein the thermal treatment is performed at a temperature of 100 to 500° C.

13. The method for preparing the conductive metal film as set forth in claim 10, wherein a pattern is formed by the applying.

* * * * *